United States Patent [19]

Maeda et al.

[11] Patent Number: 5,314,538

[45] Date of Patent: May 24, 1994

[54] APPARATUS FOR MANUFACTURING SEMICONDUCTOR DEVICE AND METHOD FOR MANUFACTURING SEMICONDUCTOR DEVICE

[75] Inventors: Kazuo Maeda; Noboru Tokumasu; Yuhko Nishimoto, all of Tokyo, Japan

[73] Assignees: Semiconductor Process Laboratory; Canon Sales Co., Inc.; Alcan Tech Co., Inc., all of Japan

[21] Appl. No.: 958,105

[22] PCT Filed: Apr. 14, 1992

[86] PCT No.: PCT/JP92/00468

§ 371 Date: Dec. 22, 1992

§ 102(e) Date: Dec. 22, 1992

[30] Foreign Application Priority Data

Apr. 22, 1991 [JP] Japan ................. 3-90612

[51] Int. Cl.⁵ ............................................. C23C 16/00
[52] U.S. Cl. ................................. 118/715; 414/935; 414/941; 29/25.01; 437/925; 118/725; 118/729
[58] Field of Search ............... 29/25.01; 118/715, 725, 118/729; 437/925; 414/DIG. 1, DIG. 7

[56] References Cited

U.S. PATENT DOCUMENTS

| 4,846,623 | 7/1989 | Otani et al. | 414/225 |
| 5,067,218 | 11/1991 | Williams | 29/25.01 |
| 5,118,642 | 6/1992 | Yoshino et al. | 437/225 |
| 5,174,827 | 12/1992 | Misiano et al. | 118/719 |
| 5,174,881 | 12/1992 | Iwasaki et al. | 204/298.25 |

*Primary Examiner*—Olik Chaudhuri
*Assistant Examiner*—Richard A. Booth
*Attorney, Agent, or Firm*—Lorusso & Loud

[57] ABSTRACT

An apparatus and method for manufacturing a semiconductor device capable of forming a single layer film or a multilayer film of improved quality by continuously processing without exposure of the wafer to the ambient air. The apparatus includes a film forming section having a gas dispersion unit for supplying reaction gas, a processing section for processing the formed film and a wafer holder for holding a wafer facing the gas dispersion unit or the processing section. The wafer holder moves the wafer between the film forming section and the processing section while heating the wafer by a heating element contained therein.

3 Claims, 11 Drawing Sheets

WAFER MOVING DIRECTION

FIG. 1(a)
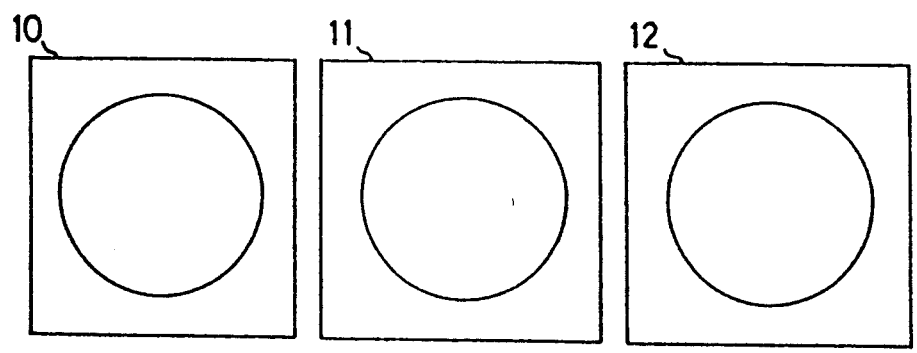
WAFER MOVING DIRECTION
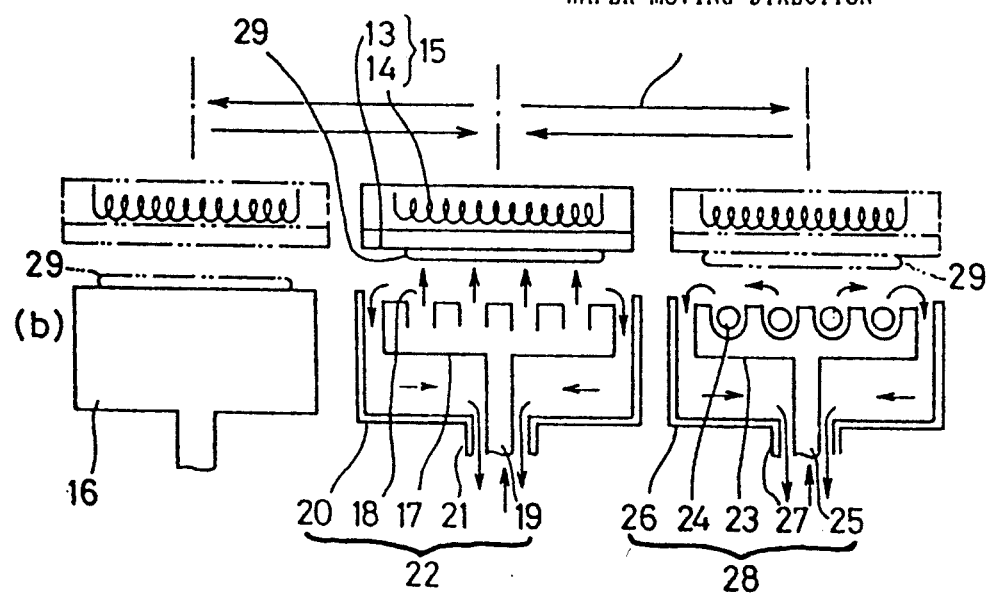
FIG. 1(b)

FIG. 7(a)
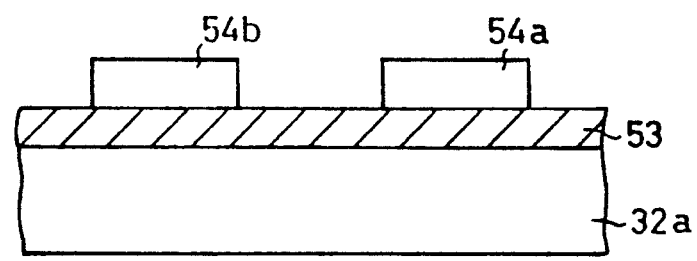
FIG. 7(b)
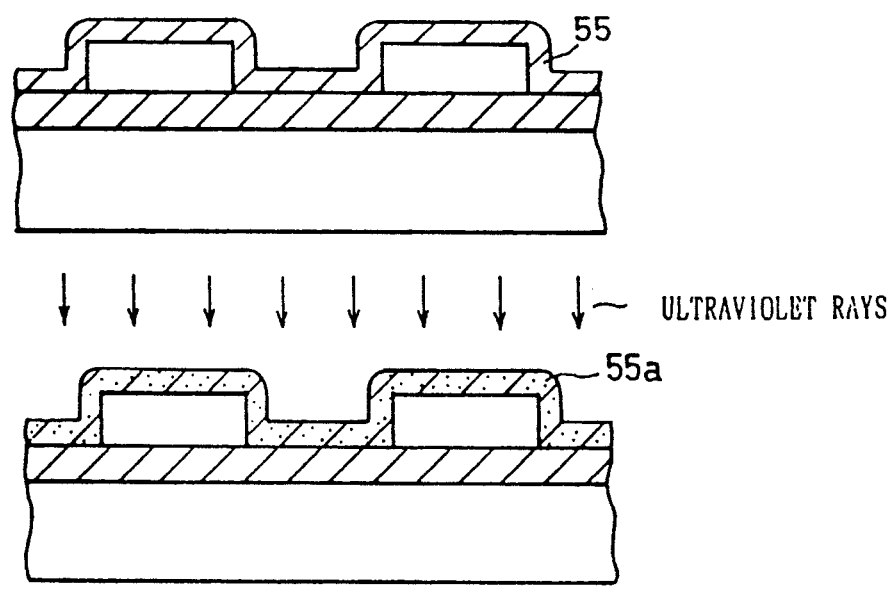
FIG. 7(c)
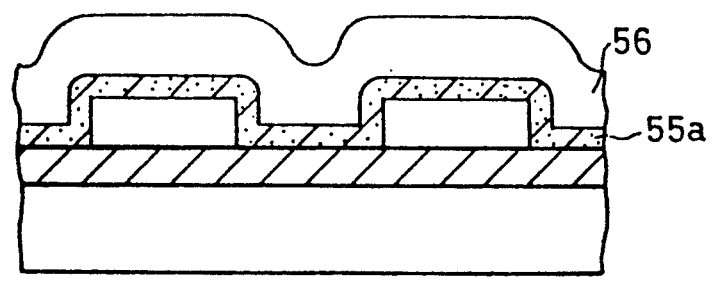
FIG. 7(d)

APPARATUS FOR MANUFACTURING SEMICONDUCTOR DEVICE AND METHOD FOR MANUFACTURING SEMICONDUCTOR DEVICE

FIELD OF THE INVENTION

The present invention relates to an apparatus and method for manufacturing a semiconductor device of the type referred to as a multistep process and apparatus which are capable of forming a single layer film and a multilayer film having improved film quality by performing different types of processings continuously without having the wafer exposed to the ambient air.

PRIOR ART

In apparatus for manufacturing a very large integrated circuit (VLSI) semiconductor device, apparatus providing for performance of several process steps continuously without having the semiconductor device exposed to the ambient air has become the trend in recent years, thus making it possible to aim at improvement of the film quality of a formed film and the like and improvement of adhesion among multiple layers of the film. As the combination of process steps, for example, film formation and etch back after film formation, processing before oxidation and formation of an oxide film, and continuous formation of a barrier metal film/a metal film may be mentioned.

As representative apparatus for manufacturing a semiconductor device capable of such processing, there are what is called a multi-chamber process apparatus using multi-chambers, a multistep process apparatus and a cluster apparatus in which respective processing sections are arranged in close vicinity to one another and the like.

FIG. 10 is a block diagram showing an apparatus for manufacturing a semiconductor device in which an insulating film is formed on a wafer by performing different types of process steps continuously using conventional multi-chambers.

In FIG. 10, a reference numeral 1 represents a cassette chamber for preparing to carry a wafer into and out of the multi-chambers, 3 represents a load-lock chamber for adjusting the pressure between chambers upon entry and exit of the wafer, 7a represents a valve for opening and closing communication between the cassette chamber 1 and the load-lock chamber 3, 4 represents a buffer chamber where a robot 5 for carrying the wafer is installed, 7b is a valve for opening and closing communication between the load-lock chamber 3 and the buffer chamber 4, and 6a to 6e represent processing chambers arranged radially with respect to the buffer chamber 4 as the center. They are used for the purposes described hereunder. For example:

(1) the processing chamber 6a is used for forming a $SiO_2$ film (film formation temperature at 400° C.) by a plasma chemical vapor deposition (CVD) method;

(2) the processing chamber 6b is used for forming a PSG film (film formation temperature at 400° C.) by a low pressure CVD method;

(3) the processing chamber 6c is used for etching back (at room temperature) of a formed film;

(4) the processing chamber 6d is used for forming a $Si_3N_4$ film (film formation temperature at 400° C.) by a plasma CVD method; and (5) the processing chamber 6e is used for forming a $SiO_2$ film (film formation temperature at 400° C.) by a low pressure CVD method. Moreover, heaters (not illustrated) for maintaining a wafer 9 at the film formation temperature are provided in respective processing chambers 6a to 6e. Further, 8a to 8e represent valves for opening and closing the ports providing communication between the buffer chamber 4 and respective processing chambers 6a to 6e. In addition, 2 represents a robot for delivering the wafer 9 from the cassette chamber 1 to a robot (not illustrated) provided in the load-lock chamber 3.

When a flat multi-layer insulating film composed of $SiO_2$ film/PSG film is formed using the above-described apparatus, the wafer 9 moves among the chambers as described hereunder. Namely, the robot 5 carries the wafer 9 into and out of respective processing chambers 6a, 6b and 6c so that respective processes are performed in the order of the processing chamber 6a/the processing chamber 6b/the processing chamber 6c.

The heaters for heating and maintaining the wafer 9 at the film formation temperature are provided in respective processing chambers 6a, 6b and 6c, and the temperature of the wafer 9 varies between the room temperature and the film formation temperature as the wafer 9 is transferred among the processing chambers 6a, 6b and 6c. In the above-described example for instance, the temperature varies as follows: 25° C./400° C./25° C./400° C./25° C. As a result, there is the problem that the wafer 9 is subject to a certain type of temperature cycle, degradation and deterioration of the film quality of the formed CVD film or generation of stress in the formed film.

Further, in a process requiring annealing after forming a CVD film, the wafer is taken out and housed in a cassette once after forming a CVD film, and the cassette is moved and thereafter inserted into a heating furnace for heat processing. Temperature hysteresis of a wafer in such a case is shown in FIG. 11.

In this case, there is also a problem that the wafer temperature varies more sharply than a conventional example shown in FIG. 10, i.e. from room temperature to 1,000° C.

Accordingly, it is an object of the present invention to provide an apparatus and method for manufacturing a semiconductor device that are capable of preventing thermal distortion and the like and also capable of preventing variation and deterioration of the quality of the formed film by reducing the variation of the wafer temperature while different types of processes are performed successively.

DISCLOSURE OF THE INVENTION

The apparatus for manufacturing a semiconductor device of the present invention includes a film forming section having a gas dispersion unit for supplying reaction gas from a gas releasing surface, a processing section having means for processing the formed film, and a wafer holder which is capable of holding a wafer on a wafer support surface opposing the gas releasing surface or the processing means and moving between the film forming section and the processing section successively while holding the wafer as it is on the wafer setting surface, wherein the wafer holder is provided with heating means capable of heating the wafer held on the wafer support surface including the period while the wafer is being moved.

The processing section may have means for infrared radiation, means for ultraviolet radiation or means for supplying a processing gas.

After forming a film in the film forming section, in processing at other locations, i.e., reflow processing of a film, processing by ultraviolet radiation or annealing in a ozone gas atmosphere, it is possible to reduce temperature variation of the wafer by preventing natural cooling of the wafer during movement by continuously heating the wafer with the heating means.

The plural gas dispersion units may have means for supplying different reaction gases. Thus, when different types of plural films are formed on the wafer, it is possible to maintain the wafer temperature at approximately the forming temperature of one film, for example during the periods of moving the wafer for forming successive films. Thus, it is possible to reduce variation of the wafer temperature by preventing natural cooling during the movement of the wafer and to prevent change and deterioration of the film quality of the formed film by preventing generation of thermal distortion and the like in the formed film.

The method of the present invention for manufacturing a semiconductor device includes heating a wafer placed on a wafer support surface of a wafer holder having heating means so as to maintain it at a first temperature while supplying reaction gas onto the surface of the wafer so as to form a film on the surface of the wafer. The wafer temperature is then raised to a second temperature higher than the first temperature by infrared heating or by use of the wafer holder heating means, thus heat treating the film. With this procedure, it is possible to perform processing continuously without lowering the wafer temperature as in the past. Thus, it is possible to reduce variation of the wafer temperature. As a result, it is possible to prevent thermal distortion of the formed film, thereby preventing change and deterioration of the film quality of the formed film.

The process further includes heating the wafer, while on a wafer support surface of a wafer holder, to a third temperature and supplying reaction gas onto the surface of the wafer so as to form a film on the surface of the wafer in a film forming section and maintaining the wafer temperature at a third temperature or heating to a fourth temperature by adjustment of the wafer holder heating means while moving the wafer holder from the film forming section to the processing section for processing by ultraviolet radiation or contact with processing gas. Thus, the wafer temperature only varies between the third temperature and the fourth temperature without cooling during movement. Therefore, it is possible to prevent change and deterioration of the film quality of the formed film.

The wafer, while on the wafer support surface of the wafer holder having heating means may be heated by the heating means to a fifth temperature, while supplying a first reaction gas onto the surface of the wafer so as to form a first film on the wafer surface in a first film forming section. While maintaining the wafer temperature at the fifth temperature or heating to a sixth temperature by adjusting the heating means after moving the wafer holder to a second film forming section, a second reaction gas is contacted with the wafer so as to form a second film over the first film. As a result, the wafer temperature only varies between the fifth temperature and the sixth temperature and the wafer is prevented from being cooled naturally during movement, to reduce variation of the wafer temperature. Therefore, it is possible to prevent change and deterioration of the film quality of the formed film.

BRIEF DESCRIPTION OF THE DRAWINGS

FIG. 1 is a block diagram of apparatus of a first embodiment of the present invention;

FIGS. 7(a)–7(d) are sectional views explaining a method for forming a film according to a second method embodiment of the present invention;

DESCRIPTION OF THE PREFERRED EMBODIMENTS

Figure 2:
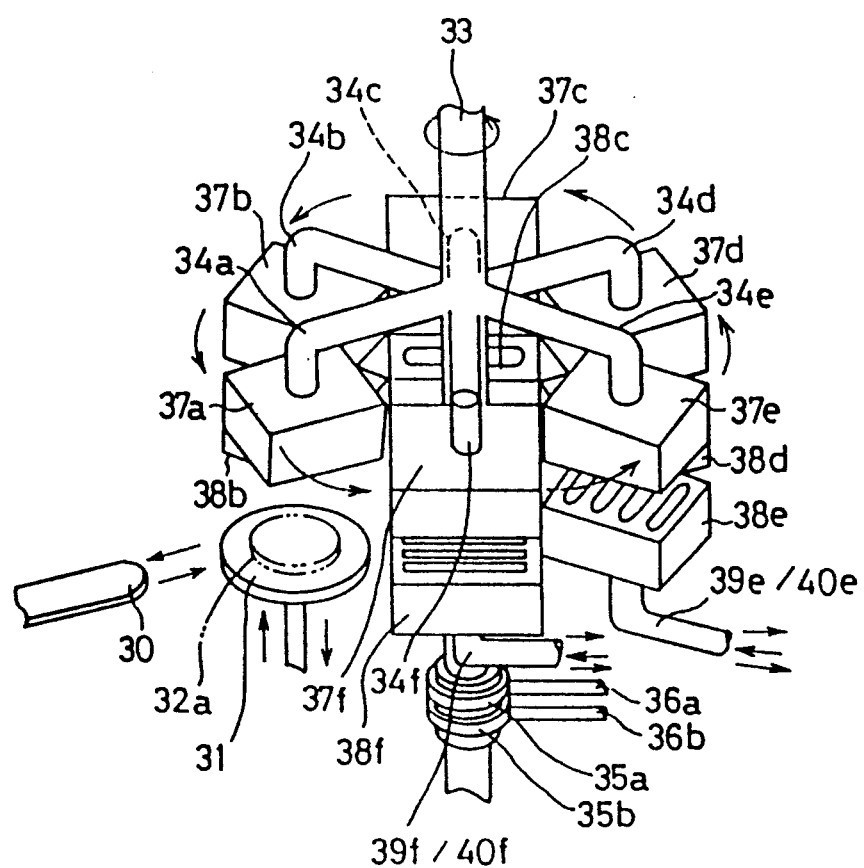
FIG. 2 is a perspective view of apparatus of a second embodiment of the present invention.

Embodiments of the present invention will be described hereinafter with reference to the drawings.

(1) First Apparatus Embodiment

FIGS. 1(a) and (b) show a multistep process apparatus of the first embodiment of the present invention, in which FIG. 1(a) is a plan view and FIG. 1(b) is a side view.

The apparatus shown in FIGS. 1(a) and (b) includes a load/unload chamber 10, a CVD reaction chamber (a film forming section) 11 and an infrared heat processing chamber (a processing section) 12 which are interconnected. A BPSG film is formed by a CVD method on a wafer surface held face downward in order to prevent contamination by dust and the like, and reflow processing is performed to flatten the wafer surface. Optionally, valves for opening and closing partition walls among respective chambers and portions of the respective chambers may be provided.

A robot 16 provided in the load/unload chamber 10 carries in and carries out a wafer 29 from the outside of the load/unload chamber 10.

A gas dispersion unit 22 provided in the CVD reaction chamber 11, introduces reaction gas through a reaction gas introduction port 19 and disperses reaction gas upwards from a gas nozzle 17. Then, the reaction gas which has completed reaction is collected by a gas collector 20 surrounding the peripheral part of the gas nozzle 17 and is exhausted from the CVD reaction chamber 11 through a gas discharge port 21.

Infrared radiation means 28 (processing means) is provided in the infrared heat processing chamber 12, and includes infrared ray lamps 24 held by an infrared ray lamp holder 23 and a gas introduction port 25 for contacting inert gas with the wafer 29 to prevent oxidation. The inert gas after contacting the surface of the wafer 29 is collected by the gas collector provided around the infrared ray lamp holder 23, and is discharged from the infrared heat processing chamber 12 through a gas exhaust port 27.

A wafer holder 15, which holds the wafer 29 face downward to prevent contamination by dust and the like, moves among the load/unload chamber 10, the CVD reaction chamber 11 and the infrared heat processing chamber 12 while holding the wafer 29 as is. Further, a heater (heating means) 14 is buried in the wafer holder 15 so as to heat and maintain the wafer 29 placed on wafer support surface 13 at a predetermined temperature.

As described above, the multistep process apparatus of the first embodiment of the present invention includes CVD reaction chamber 11 having the gas dispersion unit 22 for supplying the reaction gas onto the wafer 29, an infrared heat processing chamber 12 for heating and reflowing a film such as a formed BPSG film, and the wafer holder 15 capable of moving between the CVD reaction chamber 11 and the infrared heat processing chamber 12 successively while holding the wafer 29. As noted above, wafer holder 15 incorporates heater 14 for heating the wafer 29 including the period while the wafer 29 is moving.

Accordingly, when reflow processing of a BPSG film is performed by the infrared radiation means 28 in the infrared heat processing chamber 12 after a film such as a BPSG film is formed in the CVD reaction chamber 11, it is possible to maintain the wafer temperature at a predetermined temperature by adjusting heating by means of the heater 14. Thus, it is possible to reduce the temperature variation in the wafer 29.

In the first embodiment an infrared heat processing chamber 12 is shown connected to the CVD reaction chamber 11, but an ultraviolet processing chamber or an ozone processing chamber may be substituted for the infrared heat processing chamber 12. With this apparatus it is possible to densify a film such as a BPSG film by filling with dangling bond and also to prevent generation of thermal distortion in a formed film by reducing temperature variation of the wafer 29, thereby improving film quality.

(2) The Second Apparatus Embodiment

Figure 3A:
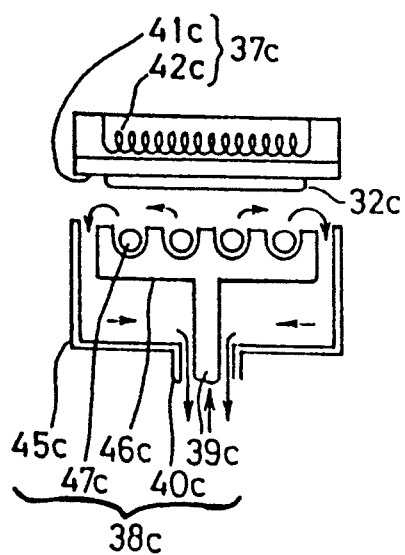
FIGS. 3(a), 3(b) and 3(c) are schematic diagrams of a film forming section and a processing section of apparatus according to the second embodiment of the present invention.
Figure 3B:
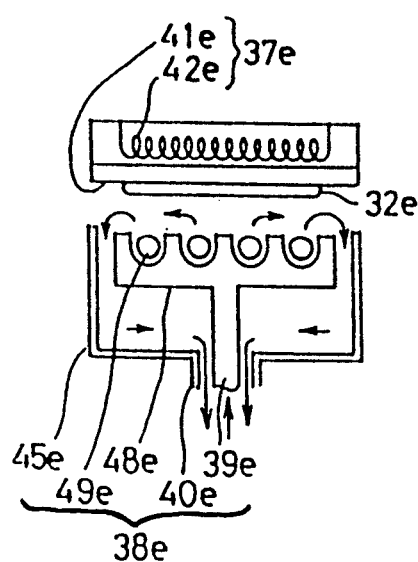
Figure 3C:
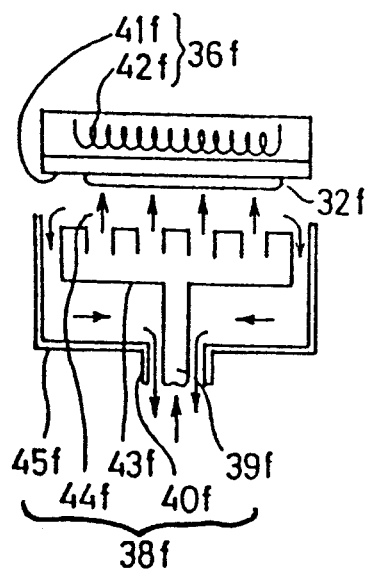
Figure 4:
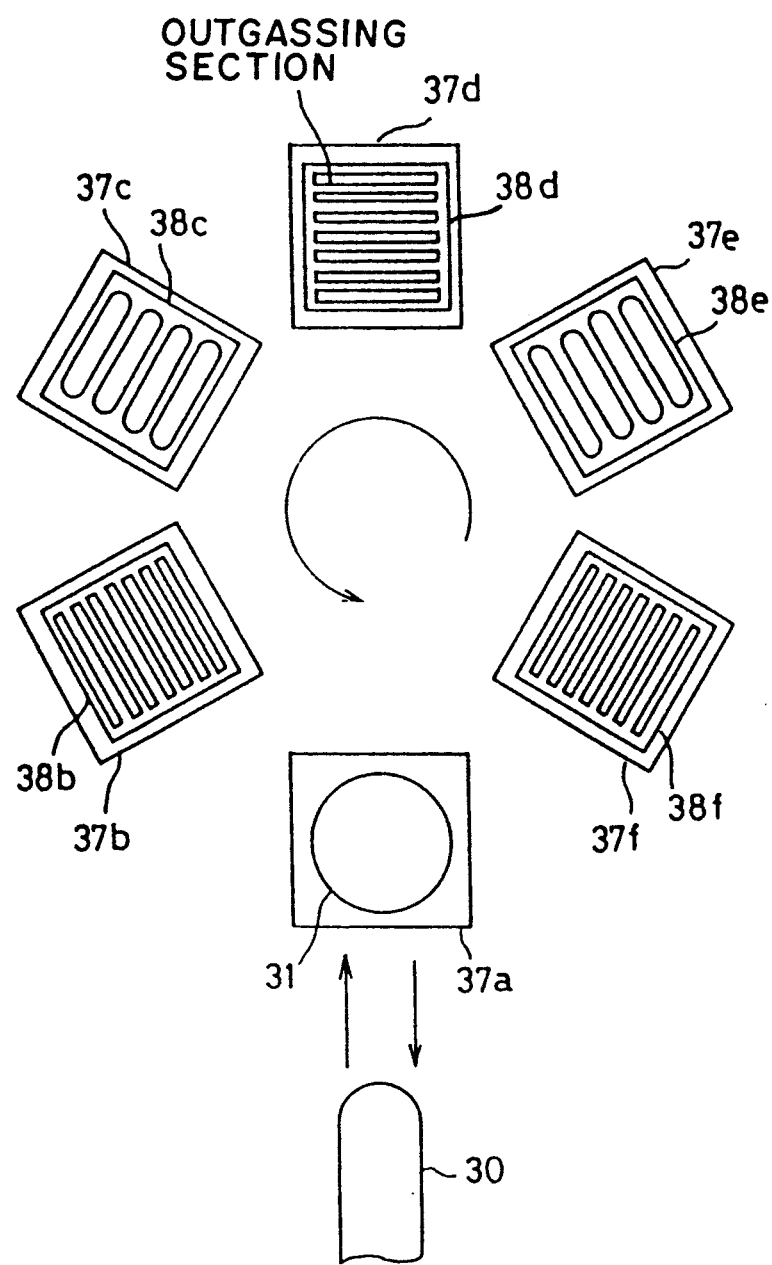
FIG. 4 is a plan view of apparatus according to the second embodiment of the present invention.

FIG. 2, FIGS. 3(a) to (c) and FIG. 4 show multistep process apparatus according to a second embodiment of the present invention, in which FIG. 2 is a perspective view of the whole apparatus, FIGS. 3(a) to (c) show side views of the infrared radiation means, the ultraviolet radiation means and the gas dispersion unit, and FIG. 4 is a plan view of the whole apparatus, respectively.

The second apparatus embodiment is distinguished from the first embodiment of FIGS. 1(a) and (b) in that the CVD reaction chamber and respective processing chambers are arranged in a circle around a central rotary shaft. Wafer holders 37a-37f, each having a heater (heating means), also move around the circle. In this multistep process apparatus, it is possible to form, for example, an insulating film having a 3-layer construction in which a BPSG film flattened by reflow is formed between $SiO_2$ films.

In FIG. 2, FIGS. 3(a) to (c) and FIG. 4, 37a to 37f shown in FIGS. 3(a) to (c) represent wafer holders which are separate from one another, and respective wafer holders 37a to 37f are fixed to the rotary shaft 33 by means of arms 34a to 34f. Further, wafer support surfaces 41a to 41f of the wafer holders 37a to 37f are rotated around the rotary shaft 33 in a plane by rotating the rotary shaft 33. Respective wafer holders 37a to 37f are connected to an exhaust unit (not illustrated) and wafers 32a to 32f are fixed to and separated from the wafer support surfaces 41a to 41f by means of chucks which communicate with a suction port and receive nitrogen gas through pipe-shaped arms 34a to 34f. Further, heaters (heating means) 42a to 42f are buried in respective wafer holders 37a to 37f individually, and electric power is supplied independently to respective heaters 42a to 42f so that heating and thermal insulation of the wafers 32a to 32f placed on the respective wafer holders 37a to 37f may be performed individually.

38b to 38f represent gas dispersion units for a first film forming section/infrared radiation means (processing means) of the first processing section/a gas dispersion unit of a second film forming section/ultraviolet radiation means (processing means) of the second processing section/a gas dispersion unit of the third film forming section, respectively, and are mounted facing wafer support surfaces 41b to 41f of the wafer holders 37b to 37f. Gas dispersion units 38b to 38f are spaced from the wafer holders 37b to 37f and are fixed to a base of the apparatus (not illustrated) around the circumstance of the rotary shaft 33.

Respective gas dispersion units 38b, 38d and 38f have gas nozzles 43b, 43d and 43f for supplying the reaction gas to the wafers 32b, 32d and 32f and gas collectors 45b, 45d and 45f for collecting the gas after reaction is completed. Reaction gas introduction ports 39b, 39d and 39f are connected to the gas nozzles 43b, 43d and 43f, and the gas discharge ports 40b, 40d and 40f are connected to the gas collectors 45b, 45d and 45f as shown typically for the gas dispersion unit 38f in FIG. 3(c). Furthermore, as shown in FIG. 4, the gas discharge sections of respective gas dispersion units 38b, 38d and 38f are provided with a plurality of slits in a direction perpendicular to the radial direction with the rotary shaft 33 as the center.

Further, as shown in FIG. 3(a), infrared radiation means 38c includes infrared ray lamps 47c for heating the wafer 32c, an infrared ray lamp holder 46c for holding the infrared ray lamps 47c, and a gas collector 45c for collecting inert gas discharged onto the wafer for preventing oxidation. A gas introduction port 39c is connected to the infrared ray lamp holder 46c and a gas discharge port 40c is connected to a gas collector 45c. Furthermore, as shown in FIG. 3(b), ultraviolet radiation means 38e includes mercury lamps 49e for heating the wafer 32e, a mercury lamp holder 48e for holding the mercury lamps 49e and a gas collector 45e for collecting inert gas discharged onto the wafer for preventing oxidation. A gas introduction port 39e is connected to the mercury lamp holder 48e and a gas discharge port 40e is connected to the gas collector 45e.

Slip rings 35a and 35b shown in FIG. 2 connected to the heater 42a contact a pair of collector rings 36a and 36b. The slip rings 35a and 35b are mounted on the rotary shaft 33 for rotation therewith and provide positive and negative polarities. The pair of collector rings 36a and 36b are connected to a power source (not illustrated) so that electric power may be supplied to the heaters 42a to 42f through the slip rings 35a and 35b. While only the slip rings 35a and 35b connected to the heater 42a of one wafer holder 37a are illustrated in FIG. 2, slip rings connected to the heaters 42b to 42f of other wafer holders 37b to 37f are also provided on the rotary shaft 33. Further, rotary connectors are used for both slip rings 35a and 35b to allow for rotation of the rotary shaft 33.

Adjacent the wafer holder 37a is a loader/unloader section where an elevator 31 is installed as shown in FIG. 2, and the wafer 32a is transferred between the elevator 31 and the wafer holder 37a only, and no film is formed.

In the multistep process apparatus of the second embodiment as described above, it becomes possible to form different types of multilayer films by provision of plural gas dispersion units 38b, 38d and 38f, separately from one another. The infrared radiation means 38c and the ultraviolet radiation means 38e provide for formation of a flat insulating film, processing for flattening a formed film and processing for improvement of the film quality of a formed film continuously.

In the above-described second embodiment, the infrared radiation means 38c and the ultraviolet radiation means 38e are illustrated as processing means, but means for supplying processing gas such as ozone may be provided instead, and furthermore, it is possible to increase the processing sections and to provide processing gas supplying means in addition to the infrared radiation means 38c and the ultraviolet radiation means 38e.

Furthermore, while the wafer support surfaces 41a to 41f are shown with their faces downward, the invention is also applicable to an apparatus in which the wafer support surfaces face upward.

(3) First Method Embodiment

Figure 5A:
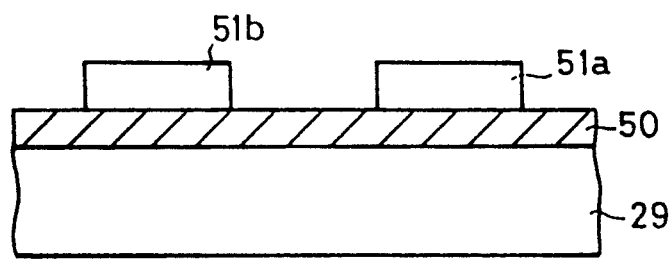
FIGS. 5(a), 5(b) and 5(c) are sectional views explaining a first embodiment of a method for forming a film according to the present invention.
Figure 5B:
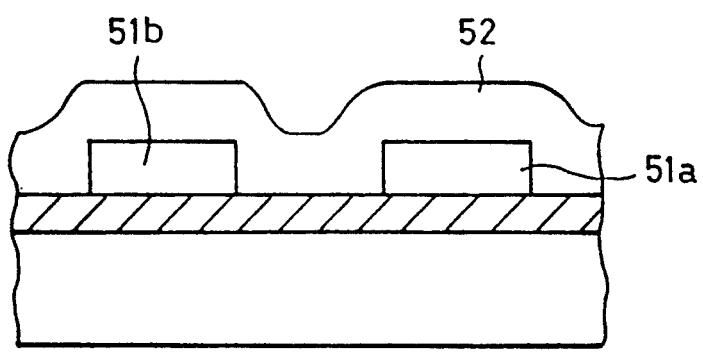
Figure 5C:
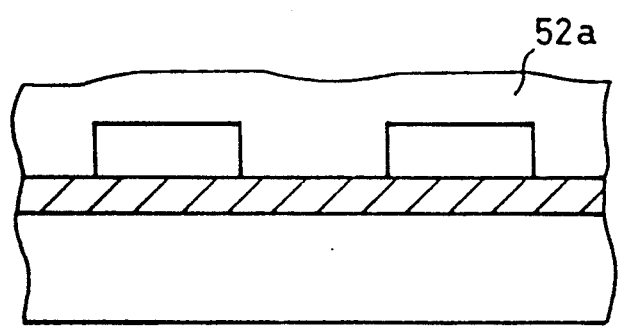
Figure 6:
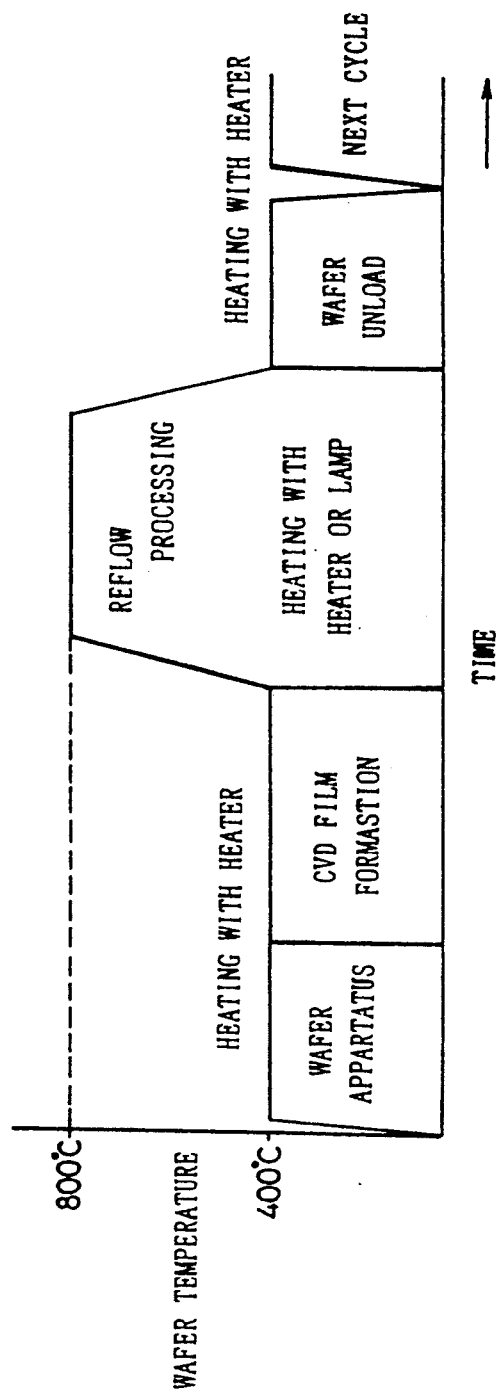
FIG. 6 is a time chart for explaining hysteresis of the wafer temperature in a method for forming a film according to the first method embodiment of the present invention.

A manufacturing method in which a flattened BPSG film is formed on a wafer surface using the multistep process apparatus shown in FIGS. 1(a) and (b) will be described with reference to FIGS. 5(a) to (c) and FIG. 6. FIGS. 5(a) to (c) are sectional views for illustrating the manufacturing method and FIG. 6 is a time chart diagram showing hysteresis of the wafer temperature during film formation processing including the wafer temperature during movement.

A Si substrate (wafer) 29 shown in FIG. 5(a), on which interconnection layers 51a and 51b composed of a polysilicon film are formed on a SiO$_2$ film 50, is first placed face downward on the wafer support surface 13 of the wafer holder 15 by the robot 16 shown in FIG. 1(b).

Next, electric current is applied to the heater 14 buried in the wafer holder 15 so as to heat the wafer 29 to a first temperature of 400° C.

Then, the wafer holder 15 is moved so as to carry the wafer 29 to the CVD reaction chamber 11. At this time, electric current is also applied to the heater 14 during conveyance, to maintain the wafer temperature at 400° C. Then, when mixed gas of TEOS/Tri-Methyl-Phosphate (TMP) containing 3.5 wt. % phosphorus Tri-Methyl-Borate (TMB) containing 4.0 wt. % boron O$_3$ is introduced into the gas nozzle 17 from the reaction gas introduction port 19, the mixed gas is discharged from the outgassing surface 18 onto the surface of the wafer 29. By continuing the mixed gas flow for a predetermined period of time, a BPSG film 52 having a predetermined film thickness is formed (FIG. 5(b)).

Then, the wafer holder 15 is moved to the infrared heat processing chamber 12. At this time, electric current is also applied to the heater 14 during conveyance of the wafer as in the movement described above to maintain the wafer temperature at 400° C.

Then, the wafer 29 carried into the infrared heat processing chamber 12 is heated further to a second temperature of 800° C. by an infrared ray lamp 24 in nitrogen gas introduced through a gas introduction port 25. As a result, the BPSG film 52 melts and flows, and the surface of the wafer 29 is flattened (FIG. 5(c)). At this time, the heat processing temperature could be lower by approximately 100° to 200° C. as compared with a conventional method for performing heat processing using a heat processing furnace after the wafer is cooled. It is believed that, since the temperature of the wafer 29 is maintained at the predetermined temperature or higher, it is possible to prevent the quality of the BPSG film 52 from changing and to prevent moisture absorption by the BPSG film 52.

As described above, in the manufacturing method of the first embodiment, as shown in the hysteresis of the wafer temperature shown in FIG. 6, the wafer 29 held by the wafer holder 15 having the heater 14 is heated by means of the heater 14 and is maintained at the temperature of 400° C. so as to form the BPSG film 52 on the surface of the wafer 29. Thereafter, the wafer 29 is heated by infrared radiation in addition to heating by the heater so as to raise the temperature of the wafer 29 from approximately 400° C. to approximately 800° C. for reflow processing of the BPSG film 52.

Accordingly, since it is possible to reflow process the BPSG film 52 continuously after the BPSG film 52 is formed without lowering the temperature of the wafer 29, the variation of the temperature of the wafer 29 can be reduced. With this, it is possible to flatten the BPSG film 52 and to prevent generation of thermal distortion in the BPSG film 52, thus preventing change and deterioration of the quality of the BPSG film 52.

While heating of the wafer 29 to 800° has been described with reference to use of the infrared ray lamp 24, it is also possible to heat the wafer 29 by using the heater 14 buried in the wafer holder 15.

Further, while reflow processing of the BPSG film 52 has been described as performed after forming the BPSG film 52, it is also possible to convey the wafer 29 while continuing heating of the wafer 29 after forming the BPSG film 52, and to perform UV radiation processing and annealing processing in an ozone atmosphere continuously with the wafer 29 maintained at a constant temperature. With this, it is possible to densify the BPSG film 52 by filling dangling bond, and also to reduce temperature variation of the wafer 29 between the time of processing and the time of conveyance so as to prevent thermal distortion in the BPSG film 52, thus improving the film quality.

(4) The Second Method Embodiment

Next, a method for forming an insulating film in three layers according to a second embodiment of the method of the present invention using the multistep process apparatus shown in FIG. 2 will be described with reference to FIGS. 7(a) to (d), FIGS. 8(e) to (g) and FIG. 9.

Figure 8A:
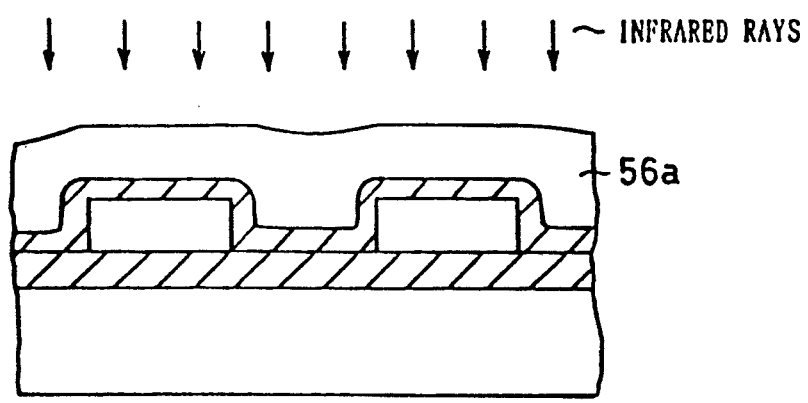
FIGS. 8(a)–8(c) show additional sectional views for explaining additional steps in a method for forming a film according to the second method embodiment of the present invention.
Figure 8B:
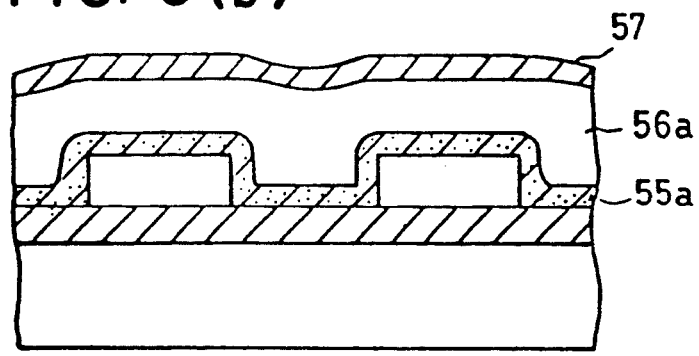
Figure 8C:
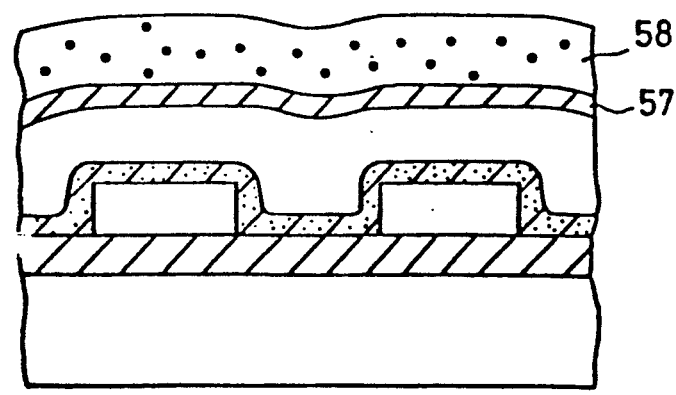
Figure 9:
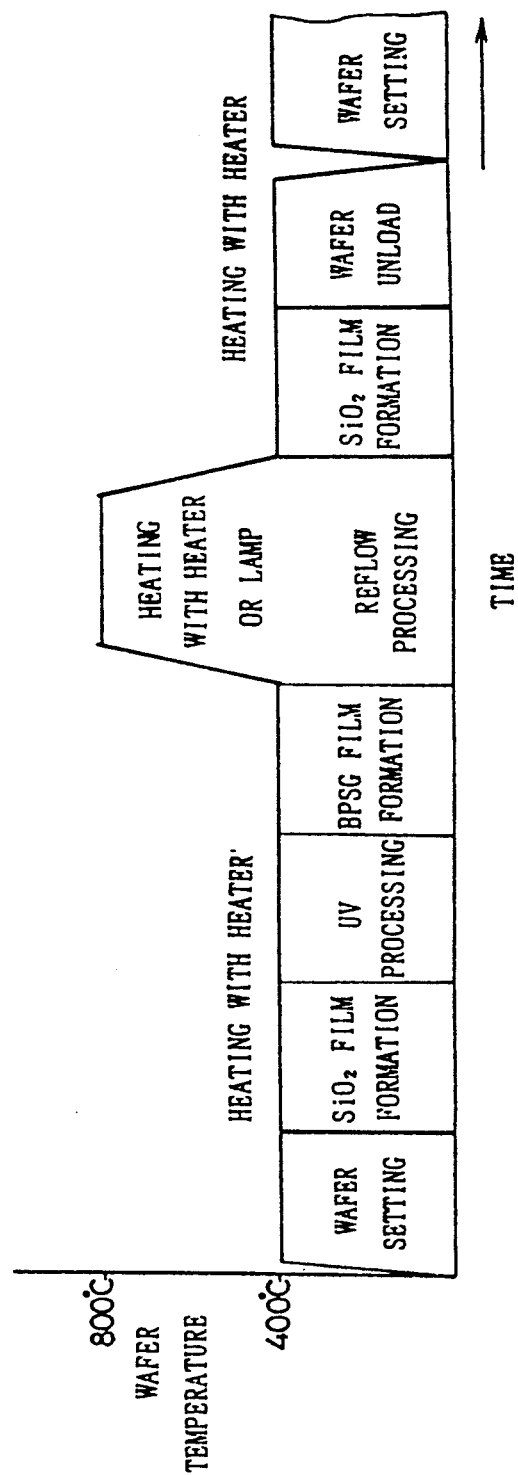
FIG. 9 is a time chart of hysteresis of the wafer temperature in the second method embodiment of the present invention.
Figure 10:
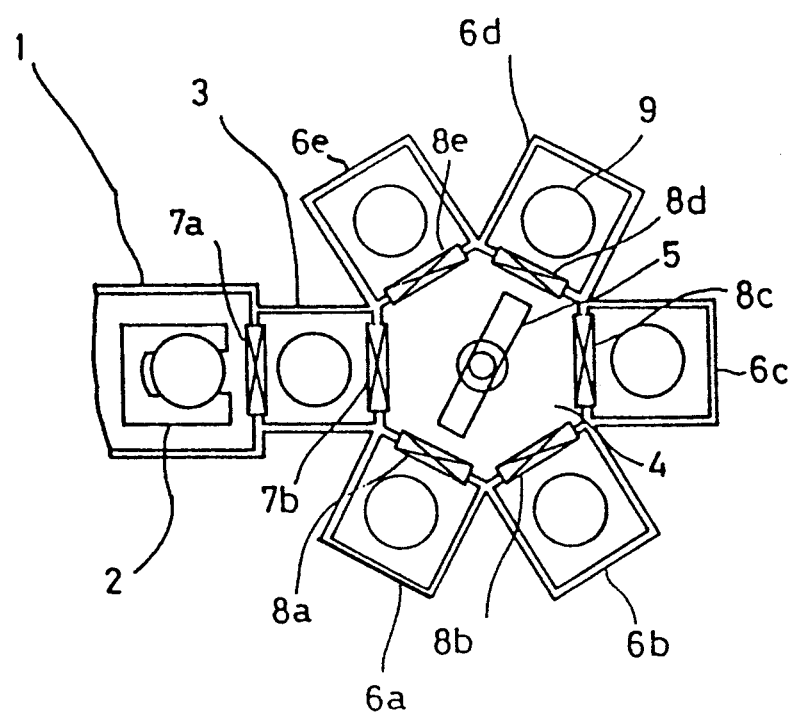
FIG. 10 is a plan view of a conventional multi-chamber process apparatus.
Figure 11:
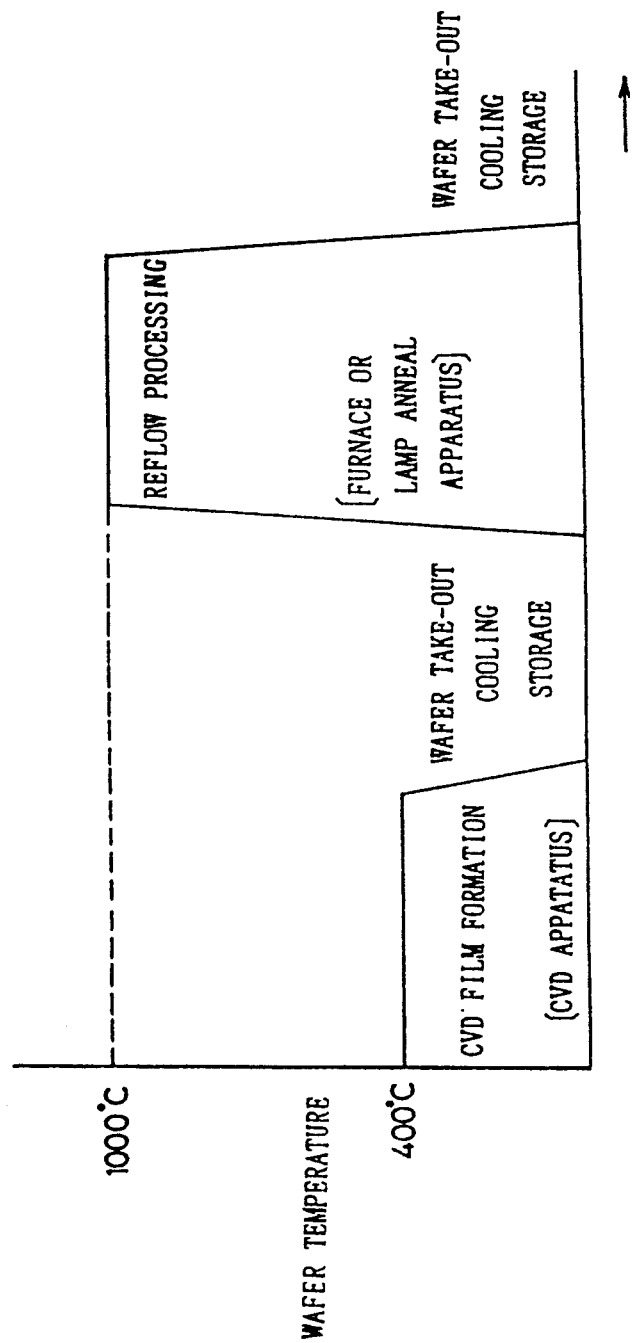
FIG. 11 is a time chart of hysteresis of the wafer temperature in a conventional method for forming a film.

FIGS. 7(a) to (d) and FIGS. 8(e) to (g) are sectional views explaining the manufacturing method, and FIG. 9 is a time chart showing the hysteresis of the wafer temperature during film formation processing including the temperature of the wafer during movement. In this case, as shown in FIG. 8(f), an insulating film having a three-layer construction of $SiO_2$ film 55a/BPSG film 56a/-$SiO_2$ film 57 having a predetermined film thickness is formed on the wafer while the wafer holder 37a goes round the rotary shaft 33. The $SiO_2$ film 55a of the lowest layer is formed for the purpose of preventing the resistance value from fluctuating by the migration of boron (B) and phosphorus (P) from the BPSG film 56a into polysilicon layers or silicide layers 54a and 54b, and the $SiO_2$ film 57 in the uppermost layer is formed for the purpose of preventing moisture absorption by the BPSG film 56a.

A first wafer 32a on which polysilicon layers or silicide layers 54a and 54b are formed on a $SiO_2$ film 53 shown in FIG. 7(a) is conveyed to the loader/unloader section and placed on the elevator 31 by means of a robot 30 shown in FIG. 2.

Then, the elevator 31 is lifted so as to bring the first wafer 32a into contact with wafer support surface 41a of the wafer holder 37a, and air is exhausted through a suction port (not illustrated) so as to place and fix the first wafer 32a onto the wafer support surface 41a by means of a chuck communicating with the suction port. At this time, electric power is supplied to heaters 42a to 42f of all the wafer holders 37a to 37f through slip rings 35a, 35b, . . . /collector rings 36a, 36b, . . . , and the temperature of the wafer support surfaces 41a to 41f of all the wafer holders 37a to 37f is maintained at approximately 400° C.

Next, after the temperature of the first wafer 32a reaches approximately 400° C., the rotary shaft 33 is rotated and the wafer holder 37a is stopped at a position right above a gas dispersion unit 38f. Then, the mixed gas of TEOS-$O_3$ is discharged from the gas nozzle 43f for reaction. At this time, a $SiO_2$ film 55 starts to grow until a $SiO_2$ film 55 having a target film thickness of approximately 2,000 Å is formed on the first wafer 32a (FIG. 7(b)) by maintaining such a state for about one minute. In the interim, a second wafer 32b is placed on the wafer holder 37b positioned at the loader/ unloader section similarly to the above, and the second wafer 32b is preheated to approximately 400° C. by means of the heater 42b.

Next, the rotary shaft 33 is rotated, and the wafer holders 37b and 37a are stopped at positions right above the gas dispersion unit 38f and the ultraviolet radiation means 38e, respectively. At this time, the first and the second wafers 32a and 32b are also heated by means of the heaters 42a and 42b during movement so that the first and the second wafers 32a and 32b are maintained at the temperature of approximately 400° C. as shown in FIG. 9. In this state, a mercury lamp 49e of the ultraviolet radiation means 38e is lighted so as to radiate ultraviolet rays onto the $SiO_2$ film 55 on the first wafer 32a. As a result, it is possible to fill dangling bond of the $SiO_2$ film 55 so as to densify the $SiO_2$ film 55a (FIG. 7(c)). The mixed gas of TEOS-$O_3$ is discharged from the gas nozzle 43f for reaction for about one minute and a $SiO_2$ film having a target film thickness of approximately 2,000 Å is thereby formed on the second wafer 32b. In the interim, a third wafer 32c is placed on the wafer holder 37c positioned at the loader/unloader section similarly to the above, and the third wafer 32c is preheated to approximately 400° C. by means of the heater 42c.

Then, the rotary shaft 33 is rotated, and the wafer holders 37c, 37b and 37a are stopped at positions right above the gas dispersion unit 38f, the ultraviolet radiation means 38e and the gas dispersion unit 38d, respectively. At this time, the first, the second and the third wafers 32a, 32b and 32c are also heated by the heaters 42a to 42c during movement so as to maintain the first, the second and the third wafers at the temperature of approximately 400° C. as shown in FIG. 9. When mixed gas of TEOS-$O_3$/TMP/TMB is discharged immediately from the gas nozzle 43d of the gas dispersion unit 38d for reaction continued for about three minutes, a BPSG film 56 having a target film thickness of approximately 6,000 Å is formed on the $SiO_2$ film 55 of the first wafer 32a (FIG. 7(d)). Meanwhile, the mercury lamp 49e radiates ultraviolet rays onto the $SiO_2$ film on the second wafer 32b. As a result, it is possible to fill dangling bond of the $SiO_2$ film so as to densify the $SiO_2$ film. Furthermore, a $SiO_2$ film having a target film thickness of approximately 2,000 Å is formed on the third wafer 32c by discharging reaction gas from the gas dispersion unit 38f. Moreover, in the interim, a fourth wafer 32d is placed on the wafer holder 37d positioned at the loader-/unloader section similarly to the above, and the fourth wafer 32d is heated to the temperature of approximately 400° C. by means of the heater 42d.

Next, the rotary shaft 33 is rotated, and the wafer holders 37d, 37c, 37b and 37a are stopped at positions right above the gas dispersion unit 38f, the ultraviolet radiation means 38e, the gas dispersion unit 38d and the infrared radiation means 38c, respectively. At this time, the first, the second, the third and the fourth wafers 32a, 32b, 32c and 32d are also heated during movement by means of the heaters 42a to 42d, and the first, the second, the third and the fourth wafers 32a, 32b, 32c and 32d are maintained at the temperature of approximately 400° C. as shown in FIG. 9. Then, in order to reflow the BPSG film 56 on the first wafer 32a, an infrared ray lamp 38c is applied to raise the wafer temperature from approximately 400° C. to approximately 800° C. and maintained there as shown in FIG. 9. When this state is maintained for a predetermined period of time, the BPSG film 56 melts and flows, and the wafer surface is levelled (FIG. 7(e)). Predetermined processing is also performed on the second, the third and the fourth wafers 32b, 32c and 32d, simultaneously with the processing of the first wafer 32a. Furthermore, in the interim, a fifth wafer 32e is placed on the wafer holder 37e positioned at the loader/unloader section similarly to the above, and the fourth wafer 32e is preheated to approximately 400° C. by means of the heater 42e.

Then, the rotary shaft 33 is rotated, and the wafer holders 37e, 37d, 37c, 37b and 37a are stopped at positions right above the gas dispersion unit 38f, the ultraviolet radiation means 38e, the gas dispersion unit 38d, the infrared radiation means 38c and the gas dispersion unit 38b, respectively. At this time, the first, the second, the third, the fourth and the fifth wafers 32a, 32b, 32c, 32d and 32e are also heated during movement by means of the heaters 42a to 42e so as to maintain the first, the second, the third, the fourth and the fifth wafers 32a, 32b, 32c, 32d and 32e at the temperature of approximately 400° C. Then, the mixed gas of TEOS-$O_3$ is discharged from the gas nozzle 43b of the gas dispersion unit 38b as reaction gas, and when this state is maintained for about one minute, a $SiO_2$ film 57 having a target film thickness of approximately 2,000 Å is formed on the first wafer 32a (FIG. 7(f)). Predetermined processing is also applied to the second, the third, the fourth and the fifth wafers 32b, 32c, 32d and 32e simultaneously with the processing of the first wafer 32a. Furthermore, in the interim, a sixth wafer 32f is placed on the wafer holder 37f positioned at the loader/unloader section similarly to the above, and the sixth wafer 32f is preheated to approximately 400° C. by means of the heater 42f.

Then, the rotary shaft 33 is rotated, and the wafer holders 37f, 37e, 37d, 37c, 37b and 37a are stopped at positions right above the gas dispersion unit 38f, the ultraviolet radiation means 38e, the gas dispersion unit 38d, the infrared radiation means 38c, the gas dispersion unit 38b and the elevator 31, respectively. Then, when the elevator 31 is lifted, the suction port corresponding to the chuck of the wafer holder 37a is closed, and the valve at the introduction port of nitrogen gas is opened so as to supply the nitrogen gas to the chuck, the first wafer 32a is separated from the wafer support surface 41a and is placed on the elevator 31. Next, the first wafer 32a is carried out to the cassette station by means of the robot 30. In the interim, predetermined processing is also applied to the second, the third, the fourth, the fifth and the sixth wafers 32b, 32c, 32d, 32e and 32f, simultaneously with the processing of the first wafer 32a.

In the same manner, the second, the third, the fourth, the fifth and the sixth wafers 32b, 32c, 32d, 32e and 32f are also prepared. Thus, when the second, the third, the fourth and the fifth wafers 32b, 32c, 32d and 32e return to the loader/unloader section again after going round the rotary shaft 33, a three layered film of $SiO_2$/BPSG/$SiO_2$ having a target thickness has been formed on these wafers. The wafers are heated by means of the heaters 42b to 42e in the interim, and always maintained at a constant temperature. Therefore, it is possible to prevent thermal distortion of the formed film due to temperature variation. In such a way, a three layered film of $SiO_2$/BPSG/$SiO_2$ of a predetermined film thickness is formed on the wafer one after another and the wafers are accumulated in the cassette station.

When an interconnection layer 58 in an upper layer composed of an Al film is formed thereafter after a via hole (not illustrated) is formed in the $SiO_2$ film 57 and a BPSG film 56a on interconnection layers 54a and 54b in a lower layer, a semiconductor device is completed (FIG. 7(g)).

As described above, according to the method for manufacturing a semiconductor device of the second embodiment, the first, the second, the third, the fourth, the fifth and the sixth wafers 32a, 32b, 32c, 32d, 32e and 32f held by the wafer holders 37a, 37b, 37c, 37d, 37e and 37f having heaters 42a to 42f are moved between the gas dispersion units 38b, 38d and 38f and respective processing sections 38c and 38e while heating these wafers and maintaining them at the temperature of approximately 400° C., to thereby form $SiO_2$ film 55a radiated with ultraviolet rays/BPSG film 56a flattened by infrared radiation/$SiO_2$ film 57 on the surfaces of the wafers 32a, 32b, 32c, 32d, 32e and 32f.

Accordingly, the wafer temperature only fluctuates between 400° C. and 800° C. as shown in FIG. 9. Since it is possible to reduce the variation of the wafer temperature by preventing the wafers 32a, 32b, 32c, 32d, 32e and 32f from cooling naturally during movement as in the past, it is possible to prevent change and deterioration of the quality of the formed film in such a manner that thermal distortion is reduced and so on.

While $SiO_2$ film 55a radiated with ultraviolet rays is formed as a $SiO_2$ film in a lowermost layer in the second method embodiment, it is also possible to form a $SiO_2$ film applied with annealing processing in an ozone atmosphere. Further, it is possible to form not only a film having the predetermined film thickness in the second embodiment, but also to form a film having another construction by combining film formation, infrared processing, ultraviolet processing, annealing processing in an ozone atmosphere and the like.

Furthermore, while heating by infrared radiation has been described for reflow processing of the BPSG film, it is also possible to apply heat processing using heaters only.

It is also possible to form a film composed of different types of multilayers of $SiO_2$/BPSG/$SiO_2$ without processing the formed film. In this case, it is also possible to reduce variation of the wafer temperature by heating the wafer while the wafer holder is moved among film forming sections. Thus, it is possible to reduce thermal distortion of the formed insulating film.

Furthermore, it is possible to unify supply of reaction gas onto the wafers 32a to 32f thereby to form $SiO_2$/BPSG/$SiO_2$ layers each having uniform film thickness and film quality by having the wafer holders 37a to 37f perform rectilinear reciprocating motion by means of oscillation units moving radially with respect to the positions of the held wafer holders 37a to 37f during film formation.

We claim:

1. An apparatus for manufacturing a semiconductor device comprising:
   a film forming section having a gas dispersion unit providing a planar gas release surface for contacting a surface of a substrate with a reaction gas to form a film on the substrate;
   a processing section having processing means for processing the formed film;
   a wafer holder having a wafer support surface for holding a wafer facing said planar gas release surface or facing said processing means and means for moving said wafer holder between said film forming section and said processing section with the wafer held on said wafer support surface; and
   heating means, mounted in said wafer holder, for heating the wafer held on said wafer support surface including the period while said wafer is moving.

2. The apparatus for manufacturing a semiconductor device according to claim 1, wherein said processing means is infrared radiation means, ultraviolet radiation means or process gas supply means.

3. An apparatus for manufacturing a semiconductor device comprising:
   a plurality of film forming sections each having a gas dispersion unit providing a planar gas release surface for contacting a surface of a substrate with a reaction gas to form a film on the substrate;
   a wafer holder having a wafer support surface facing said planar release surface and means for moving said wafer holder among said plurality of film forming sections successively while holding the wafer on said wafer support surface; and
   heating means, mounted in said wafer holder, for heating the wafer held on the wafer support surface while the wafer is moving.

* * * * *